United States Patent
Bauer et al.

(10) Patent No.: US 10,924,111 B2
(45) Date of Patent: Feb. 16, 2021

(54) INPUT DEVICE WITH FUNCTION TRIGGERING OR CONTROL WHICH TAKES PLACE BASED ON CAPACITIVELY MEASURED ACTUATION FORCE AND ADAPTATION BY MEANS OF CAPACITIVE CONTACT DETECTION

(71) Applicant: PREH GMBH, Bad Neustadt a. d. Saale (DE)

(72) Inventors: Norbert Bauer, Bad Neustadt (DE); Thomas Kleffel, Höchberg (DE); Jochen Schlereth, Sondheim (DE); Florian Schmitt, Stangenroth (DE)

(73) Assignee: PREH GMBH

( * ) Notice: Subject to any disclaimer, the term of this patent is extended or adjusted under 35 U.S.C. 154(b) by 32 days.

(21) Appl. No.: 16/071,333

(22) PCT Filed: Apr. 3, 2017

(86) PCT No.: PCT/EP2017/057835
§ 371 (c)(1),
(2) Date: Jul. 19, 2018

(87) PCT Pub. No.: WO2017/190900
PCT Pub. Date: Nov. 9, 2017

(65) Prior Publication Data
US 2020/0052695 A1  Feb. 13, 2020

(30) Foreign Application Priority Data

May 4, 2016 (DE) ..................... 10 2016 108 293.7

(51) Int. Cl.
*H03K 17/96* (2006.01)
*H03K 17/955* (2006.01)

(52) U.S. Cl.
CPC ......... *H03K 17/962* (2013.01); *H03K 17/955* (2013.01); *H03K 2217/94026* (2013.01); *H03K 2217/9651* (2013.01)

(58) Field of Classification Search
CPC ............... H03K 17/962; H03K 17/955; H03K 221/94026; H03K 2217/9651
See application file for complete search history.

(56) References Cited

U.S. PATENT DOCUMENTS 9,690,408 B1 * 6/2017 Krah ..................... G06F 3/0412
2010/0230181 A1 9/2010 Suzuki
(Continued)

FOREIGN PATENT DOCUMENTS

| JP | 2014228335 A | 12/2014 |
| WO | 2008052229 A2 | 5/2008 |
| WO | 2009012183 A2 | 1/2009 |

OTHER PUBLICATIONS

The International Search Report and the Written Opinion for PCT/EP2017/057835, dated Jun. 28, 2017, EPO, Rijswijk, The Netherlands.

*Primary Examiner* — Kwang-Su Yang
(74) *Attorney, Agent, or Firm* — M&B IP Analysts, LLC

(57) ABSTRACT

An input device is disclosed, including a capacitive force sensor, a capacitive touch sensor, and an evaluation unit, where the capacitive force sensor includes an operating surface and a first conductive electrode, and a second conductive electrode; wherein the evaluation unit is configured to detect an associated characteristic value of a touch on the operating surface during the operation, such as a location surface of action of the touch, by means of the capacitive touch sensor, and wherein the evaluation unit is further configured to detect a measured quantity changing with the operating force by generating a first measuring capacitance between the first and second electrodes and to assign a (Continued)

switching or controlling function to the operation in accordance with the characteristic value detected by the capacitive touch sensor and with the measured quantity detected in the operation-detection step.

17 Claims, 4 Drawing Sheets

(56) References Cited

U.S. PATENT DOCUMENTS

2016/0301411 A1* 10/2016 Heimann ............. H03K 17/955
2017/0308240 A1* 10/2017 Yeh ........................ G06F 3/044

* cited by examiner

INPUT DEVICE WITH FUNCTION TRIGGERING OR CONTROL WHICH TAKES PLACE BASED ON CAPACITIVELY MEASURED ACTUATION FORCE AND ADAPTATION BY MEANS OF CAPACITIVE CONTACT DETECTION

This application claims priority under 35 U.S.C. § 371 to the International Application No. PCT/EP2017/057835, filed Apr. 3, 2017, and to the German Application No. 10 2016 108 293.7, filed May 4, 2016, now pending, the contents of which are hereby incorporated by reference.

The present disclosure relates to an input device with a capacitively measured operating force and a function initiation triggered by the measured operating force or a control taking place in accordance with the measured operating force. In capacitive measurements of the operating force generally, but particularly in such cases in which the operating force acts through an input surface that is larger compared to the acting surface of an input means, such as a finger tip, so that the location of action on the input surface can vary greatly from input to input, there is the problem that the detected measured value may vary greatly. In the case of an input device, this is critical in that the triggering of a switching function to be caused by the operation or the control function to be caused by the operation thus becomes unreliable. Similar to a bouncing key, this is perceived as unpleasant by the user because he expects a uniform switching and control behavior over the entire operating surface in the case of an operating surface that is extended compared to the size of the input means, such as his finger tip. In particular, malfunctions in the case of an operation in the border area of the operating surface are to be avoided, wherein the malfunctions may be the result, for example, of no function being triggered despite an operation having taken place.

Therefore, there is a need for an input device measuring the operating force capacitively, in which the function or switching function can be associated with the operation more reliably. This object is achieved with an operating member according to claim 1. Advantageous embodiments are in each case the subject matter of the dependent claims. An equally advantageous input method is the subject matter of the independent claim. It must be noted that the features cited individually in the claims can be combined with each other in any technologically meaningful manner and represent other embodiments of the present disclosure. The description, in particular in connection with the figures, additionally characterizes and specifies the present disclosure.

The present disclosure relates to an input device comprising a capacitive force sensor, a capacitive touch sensor assigned to the capacitive force sensor, and an evaluation unit. The capacitive force sensor includes an operating surface and a first electrode made of a conductive material, which yields elastically under the action of an operating force acting during an operation, and a second electrode made of a conductive material, which is disposed adjacent to and spaced apart from the first electrode. For example, the second electrode is applied to the side of a base layer, e.g. a circuit board, facing towards the operating surface. For example, the first electrode is applied to the side of an operating layer of an elastic material facing away from the operating surface. In an embodiment, a cavity filled with a dielectric and deformable, e.g., elastically deformable, medium is provided between the first and second electrodes. In one embodiment, the operating surface is formed by the operating layer. The operating surface may be connected to the operating layer and is formed by a non-conductive layer applied to the operating layer. In an embodiment, the first electrode, the second electrode and the operating surface are concentrically arranged with respect to the geometrical centers.

The evaluation unit is configured to detect, in a touch-detection step and by means of the capacitive touch sensor, an associated characteristic value of a touch on the operating surface during the operation.

The term characteristic value is to be interpreted broadly and, according to the present disclosure, is supposed to comprise the derivation of a characteristic value from the measured detection result and the direct use of the measured quantity as a characteristic value. In an embodiment, this is a location information, i.e., at which location of the operating surface the touch is taking place, wherein this information depends on the resolving power of the touch sensor and, in one embodiment, may relate to a comparatively rough location information of an outer or inner touch on the input surface. In another embodiment, the characteristic value relates to the contact surface of the touch, e.g., the circumference or the surface area of the partial surface of the input surface affected by the touch with the input means. According to the present disclosure, the evaluation unit is further configured to detect, in an operation-detection step shifted in time in relation to the touch-detection step, a measured quantity changing, e.g., continuously changing, with the operating force, by generating a first measuring capacitance between the first and second electrodes. For example, the time shift is the result of the touch-detection step being carried out before or after the operation-detection step. The touch-detection step may take place before the operation-detection step in order to be able, based on the previously determined characteristic value, to adapt the subsequent operation-detection step in accordance with the characteristic value determined immediately previously. According to the present disclosure, it is provided that a switching and/or controlling function is assigned by the evaluation unit to the operation both in accordance with the characteristic value detected by the capacitive touch sensor in the touch-detection step, e.g. the capacitance detected by the touch sensor, and in accordance with the measured quantity detected in the operation-detection step. The dual dependency of the switching or control function assignment according to the present disclosure enables not only a verification of the operation detection by means of the touch detection, but also a variation of the measured quantity caused by a change in the ambient conditions, such as temperature and air humidity, and in particular due to a change in the touch conditions, such as the location of the touch and the associated surface area, is partially compensated based on the detected characteristic value, for example. The reliability of the input device detecting the operating force capacitively is thus increased. According to an embodiment, it is provided that, in accordance with the characteristic value, a threshold for triggering the switching and/or controlling function is adapted in accordance with the measured quantity. For example, the threshold assigned to the measured quantity is reduced if the characteristic value is reduced, and vice versa. For example, different thresholds are stored in a lookup table and assigned to different non-overlapping characteristic value ranges, so that an assigned threshold is set for a corresponding characteristic value.

According to an embodiment, the first electrode is exclusively used, in the touch-detection step, as an electrode of the capacitive touch sensor generating a second measuring capacitance. Due to the close spatial proximity of the first electrode to the operating surface, a comparative determination of the characteristic value and thus a verification or adaptation of the measured-quantity determination is obtained.

In order to obtain an effective electromagnetic shielding of the sensing first electrode the evaluation unit, according to an embodiment, is configured to run the second electrode in an insulated manner in the touch-detection step, i.e., it is not contacted and may be statically discharged. For example, the second electrode is thus kept at a "floating potential" in order to avoid an influence on the second measuring capacitance.

According to an embodiment, the second electrode is grounded while the first electrode is used as the electrode generating the first measuring capacitance in the operation-detection step. This means, for example if used in a vehicle, that a potential equalization between the ground and the second electrode is effected.

In order to obtain a better spatial resolution due to a second measuring capacitance that varies greatly in space, in particular along the input surface, at least one of the first or second electrodes has a structure changing from its geometric center in the direction of the edge of the measuring capacitance. For example, the electrode has several strips or rings connected in an electrically conductive manner, and the width of the strips or rings varies and/or the distance between adjacent strips or rings varies.

According to an embodiment, it is provided that the first and second electrodes differ in the circumferences described by their maximum extents.

In an embodiment, it is provided that the surfaces described by the maximum extents of the first and second electrodes are in the range from 0.5 to 5.0 cm$^2$. In a further embodiment, the range extends from 1.0 to 4.0 cm$^2$, and in yet another embodiment, the range extends from 1.5 to 3.5 cm$^2$.

In some embodiments, it is provided that the surface described by the maximum extents of the first or by the maximum extents of the second electrode corresponds to the surface area of the operating surface. The surface described by the maximum extent of the first electrode and the surface described by the maximum extent of the second electrode and the operating surface may be concentrically arranged with respect to the geometrical centers.

According to an embodiment, a cavity delimited partially or completely by one or more spacers is provided between the first or second electrode, and the spacer or spacers have a lower elasticity than the operating layer. For example, the spacer is a plastic, such as a thermoplastic material or a cured adhesive layer.

In an embodiment, it is provided that the second electrode is exclusively used, in the touch-detection step, as an electrode of the capacitive touch sensor generating the second measuring capacitance.

In the above-described embodiment, the first electrode has through-holes. For example, the first electrode has a strip-like or grid-like structure.

In an embodiment, it is provided that the first electrode is run in an insulated manner in the touch-detection step, i.e. in a non-contacted manner.

According to an embodiment, it is provided that the first electrode is grounded in the operation-detection step.

The force sensor and the touch sensor may be integrated with each other in a common film layer structure. For example, the electrodes are formed as layers or coatings of layers of a multi-layered film layer structure. For example, the film layer structure has an adhesive layer.

According to a variant of the input device, an array of several capacitive force sensors and an associated array of capacitive touch sensors are provided, wherein the number of force sensors corresponds to the number of touch sensors.

According to a variant of the input device equipped with an array of force sensors and an array of an identical number of touch sensors, the first electrodes are configured to be electrically insulated from one another and the second electrodes are configured to be electrically insulated from one another. This enables a selective activation of the first and second electrodes.

Furthermore, the present disclosure relates to the use of the input device of one of the above-described embodiments in a motor vehicle.

The present disclosure further relates to an inputting method comprising the following steps. An input device is provided which comprises a capacitive force sensor, a capacitive touch sensor assigned to the capacitive force sensor, and an evaluation unit. The capacitive force sensor includes an operating surface, a first electrode made of a conductive material, which yields elastically under the action of an operating force acting upon the operating surface during an operation, and a second electrode made of a conductive material, which is disposed adjacent to and spaced apart from the first electrode. The method according to the present disclosure includes a touch-detection step, in which an associated characteristic value of a touch on the operating surface during the operation, such as a location and/or a circumference of the touch, is detected by means of the capacitive touch sensor and the evaluation unit. Further, the method includes an operation-detection step shifted in time in relation to the touch-detection step, in which, by means of the capacitive force sensor and the evaluation unit, a measured quantity changing with the operating force is detected by generating a first measuring capacitance between the first and second electrodes. Furthermore, the method according to the present disclosure includes a subsequent evaluation step, in which a switching and/or controlling function is assigned by the evaluation unit to the operation both in accordance with the characteristic value detected by the capacitive touch sensor in the touch-detection step, and in accordance with the measured quantity detected in the operation-detection step. The dependency of the switching or control function assignment both on the detection result of the force sensor and on the detection result of the touch sensor enables not only a verification of the operation detection by means of the touch detection, but also, a variation of the measured quantity caused by a change in the ambient conditions, such as temperature and air humidity, but in particular due to a change in the touch conditions, such as the location of the touch and the associated surface area, is partially compensated based on the detected characteristic value, for example. The reliability of the input method detecting the operating force capacitively is thus increased. According to an embodiment, it is provided that, in accordance with the characteristic value, a threshold for triggering the switching and/or controlling function is adapted in accordance with the measured quantity. For example, the threshold assigned to the measured quantity is reduced if the characteristic value is reduced, and vice versa. For example, different thresholds are stored in a lookup table and assigned to different non-overlapping characteristic value ranges, so that an assigned threshold is set for a corresponding characteristic value.

With regard to the further embodiments of the method according to the present disclosure, reference is made to the above-mentioned embodiments of the input device.

The present disclosure is explained further with reference to the following figures. The figures are to be understood only as examples and merely represent one embodiment. In the figures.

Figure 1:
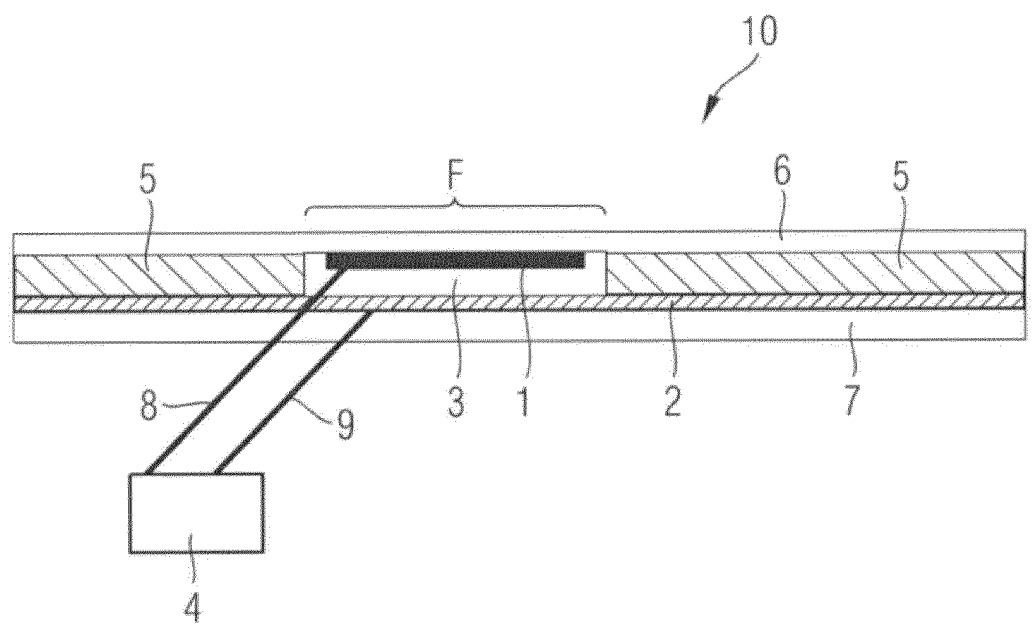
FIG. 1 shows a schematic cross-sectional view of a first embodiment of the input device according to the present disclosure.

FIG. 1 shows a first embodiment of the input device 10 according to the present disclosure. The latter has a film layer structure, which is formed with a multi-layered structure and has, inter alia, a control layer 6 which faces towards the operator and defines an operating surface F. A first electrode 1 is applied as a coating of a conductive material on the side of the control layer 6 facing away from the operator. The first electrode 1 is disposed adjacent to the operating surface F and delimits a cavity 3, whose dimensions correspond to the size of the operating surface F, underneath the operating surface F as viewed from the operator. The first electrode 1 and the operating layer 6 are made of an elastic material and are elastically deformed into the cavity 3 under the action of an operating force acting on the operating surface F. As viewed from the operator, the second electrode 2 is disposed underneath the first electrode 1 and spaced apart therefrom by the cavity 3. The cavity 3 and the spacing between the first electrode 1 and the second electrode 2 resulting therefrom is provided by means of a layer 5, which acts as a spacer, with a lower elasticity compared to the operating layer 6 and into which recesses corresponding to the cavity 3 have been incorporated. Towards the bottom, the cavity 3 is delimited by a conductive layer that forms the second electrode 2 and is applied onto a circuit board 7. The input device 10 includes an evaluation unit 4. The first electrode 1 is connected to the evaluation unit 4 via the conductor 8, and the second electrode 2 is electrically contacted by the evaluation unit 4 via the conductor 9. The course of the conductors 8, 9 shown in FIG. 1 only serves for illustrative purposes. One embodiment provides that the conductors 8, 9 extend through the film layer structure.

The configuration of the evaluation unit 4 or the mode of operation of the evaluation unit 4 is to be explained with reference to FIG. 2. It comprises a computing unit 4a and an electric switching means 4b. The switching means 4a has switching positions for alternately carrying out the operation-detection step (dashed line in the switching means 4b) and the touch-detection step (continuous line in the switching means 4b).

Figure 2:
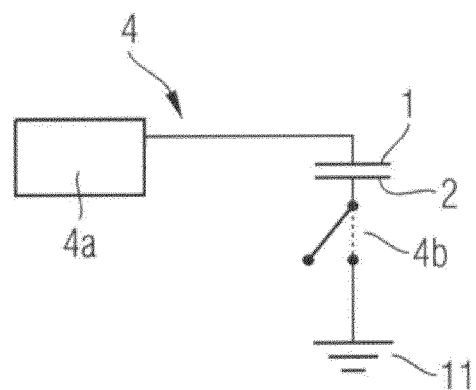
FIG. 2 shows a schematic circuit diagram for illustrating the mode of operation of the evaluation unit 4 belonging to the embodiment of FIG. 1.

In an operation-detection step (dashed line of the switching means 4b) shown in FIG. 2, potential is applied to first electrode 1 and the second electrode 2 is grounded in order to generate a first measuring capacitance substantially between the first electrode 1 and the second electrode 2. Here, ground potential is indicated with 11. In the event of an operation, i.e., the action of an operating force on the input surface F, a change in the first measuring capacitance is caused by the elastic deformation of the first electrode 1 and the accompanying change of position of the first electrode 1 relative to the second electrode 2. When a predetermined threshold of the change in measuring capacitance is reached, the operation that has taken place is supposed to be assigned a switching function by the evaluation unit 4. Given the same operating force, however, since the extent of this capacitance change is strongly dependent on the location of the action on the operating surface F, e.g., in the center or at the edges, but also on the extent of the contact surface of the operating means, there is a need for adapting this threshold. In the present disclosure, this is achieved in the preceding touch-detection step (continuous line of the switching means 4b), wherein, at the same time, the second electrode 2 is run in an insulated manner by switching over the switching means 4b in order to cause this electrode 2 to be electromagnetically neutral, while the first electrode 1 is switched in such a way that a second measuring capacitance is generated. Thus, a touch sensor is provided which, in the touch-detection step, detects a change of the second measuring capacitance resulting from an influence on the field propagation by the control means touching the operating surface F. The characteristic value detection in the touch-detection step is also threshold value-triggered, for example. A characteristic value is determined therefrom, which is characteristic for the specific touch occurring upon operation and may allow conclusions to be drawn as to the specific location of the touch during operation, wherein the information about the location may be limited to the information about which partial surface of the operating surface is being touched. Corresponding to the characteristic value, the threshold value is correspondingly adapted in order to assign a switching function to the operation by means of the evaluation unit only when the threshold value adapted by the characteristic value is exceeded during the operation that is taking place at present or has taken place previously.

Figure 3:
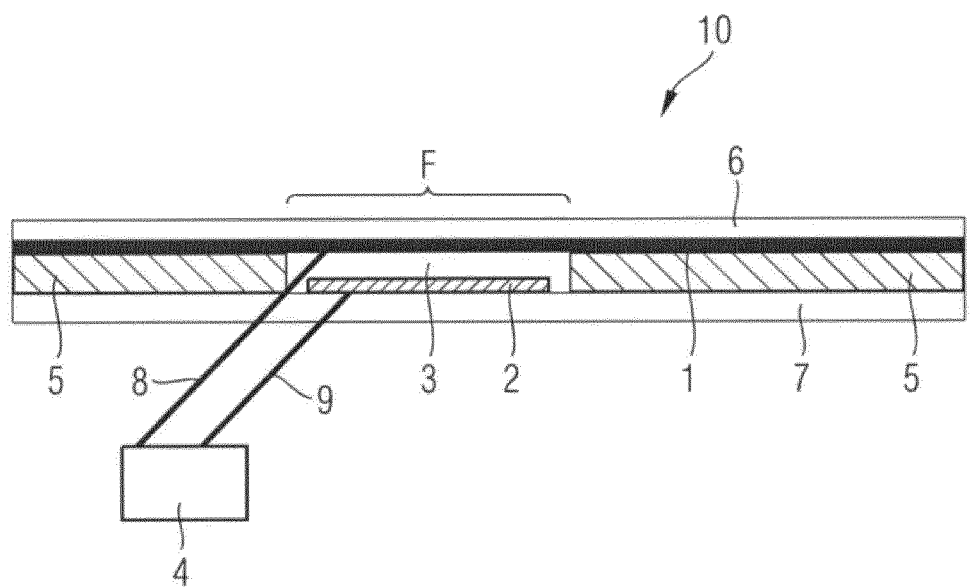
FIG. 3 shows a schematic cross-sectional view of a second embodiment of the input device according to the present disclosure.

FIG. 3 shows a second embodiment of the input device 10 according to the present disclosure. The latter also has a film layer structure, which is formed with a multi-layered structure and has, inter alia, a control layer 6 which faces towards the operator and defines an operating surface F. A first electrode 1 is applied on the operating layer 6 as a coating of a conductive material covering the entire surface on the side of the control layer 6 facing away from the operator. The first electrode 1 is disposed underneath the operating surface F and delimits a cavity 3, whose dimensions correspond to the size of the operating surface F, underneath the operating surface F as viewed from the operator. The first electrode 1 and the operating layer 6 are made of an elastic material and are elastically deformed into the cavity 3 under the action of an operating force acting on the operating surface F. The first electrode 1 has through-holes not shown in FIG. 3. As viewed from the operator, the second electrode 2 is disposed underneath the first electrode 1 and spaced apart therefrom by the cavity 3, wherein the extent of the second electrode is limited to the dimensions of the cavity 3. The cavity 3 and the spacing between the first electrode 1 and the second electrode 2 resulting therefrom is provided by means of a layer 5, which acts as a spacer, with a lower elasticity compared to the operating layer 6 and into which recesses corresponding to the cavity 3 have been incorporated. Towards the bottom, the cavity 3 is delimited by a conductive layer that forms the second electrode 2 and is applied, in some portions, to a circuit board 7. The input device 10 includes an evaluation unit 4. The first electrode 1 is connected to the evaluation unit 4 via the conductor 8, and the second electrode 2 is electrically contacted by the evaluation unit 4 via the conductor 9. The course of the conductors 8, 9 shown in FIG. 3 only serves for illustrative purposes. One embodiment provides that the conductors 8, 9 extend through the film layer structure.

The configuration of the evaluation unit 4 or the mode of operation of the evaluation unit 4 is to be explained with reference to FIG. 4. It comprises a computing unit 4a and an electric switching means 4b. The switching means 4b has switching positions for alternately carrying out the operation-detection step (continuous line in the switching means 4b) and the touch-detection step (dashed line in the switching means 4b). In an operation-detection step shown in FIG. 4, the first electrode 1 and the second electrode 2 are contacted by the evaluation unit 4 while a first measuring capacitance is generated substantially between the first electrode 1 and the second electrode 2. In the event of an operation, i.e., the action of an operating force F on the input surface F, a change in the first measuring capacitance is caused by the elastic deformation of the first electrode 1 and the accompanying change of position of the first electrode 1 relative to the second electrode 2. When a predetermined threshold of the change in measuring capacitance is reached, the operation that has taken place is supposed to be assigned a switching function by the evaluation unit 4. Given the same operating force, however, since the extent of this capacitance change is strongly dependent on the location of the action on the operating surface F, e.g., in the center or at the edges, but also on the extent of the contact surface of the operating means, there is a need for adapting this threshold. In the present disclosure, this is achieved in the preceding touch-detection step, wherein, at the same time, the first electrode 1 is run in a non-contacted, insulated manner by switching over the switching means 4b, so that it constitutes a weak electromagnetic influence, while the second electrode 2 is switched in such a way that a second measuring capacitance is generated whose field is capable of penetrating the through-holes of the first electrode 1.

Thus, a touch sensor is provided which, in the touch-detection step, detects a change of the second measuring capacitance resulting from an influence on the field propagation by the control means touching the operating surface F. A characteristic value is determined therefrom, which is characteristic for the specific touch occurring upon operation and may allow conclusions to be drawn as to the specific location of the touch during operation, wherein the information about the location may be limited to the information about which partial surface of the operating surface is being touched. Corresponding to the characteristic value, the threshold value is correspondingly adapted in order to assign a switching function to the operation by means of the evaluation unit only when the threshold value adapted by the characteristic value is exceeded during the operation that is taking place at present or has taken place previously.

Figure 4:
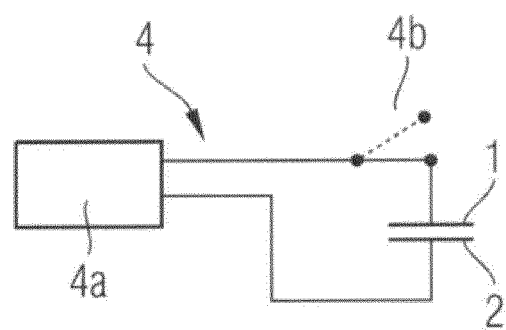
FIG. 4 shows a schematic circuit diagram for illustrating the mode of operation of the evaluation unit 4 belonging to the embodiment of FIG. 3.
Figure 5:
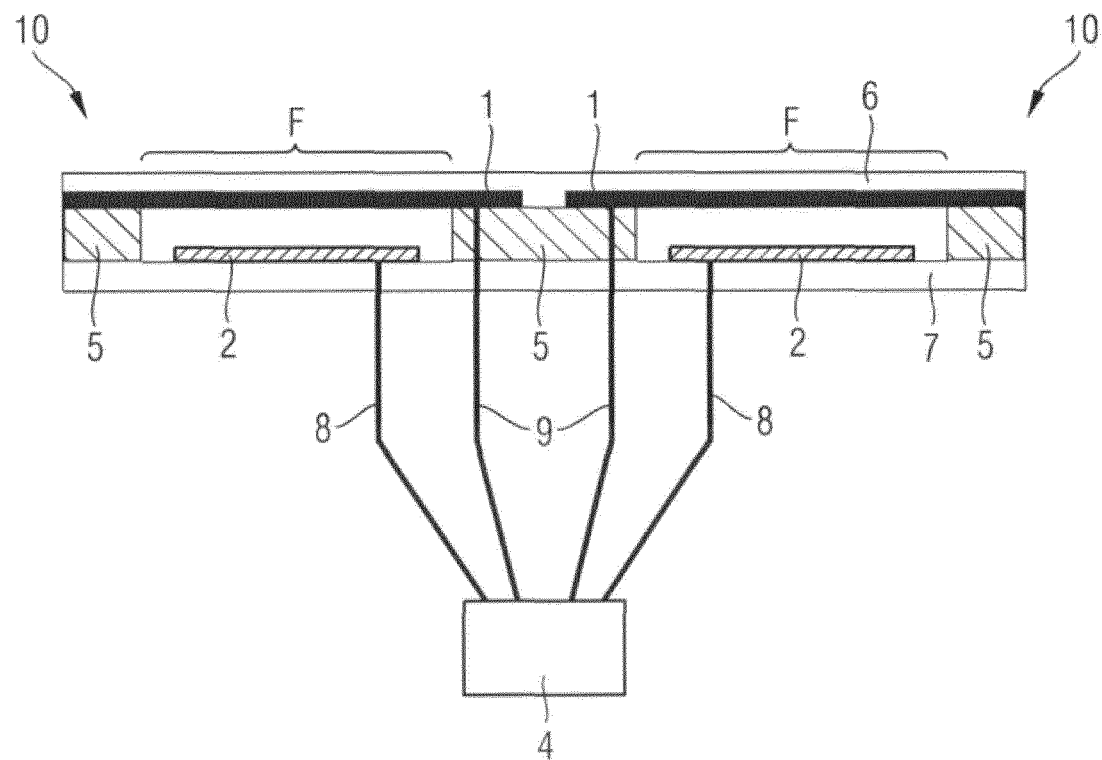
FIG. 5 shows a schematic cross-sectional view of a third embodiment of the input device according to the present disclosure.

FIG. 5 shows an embodiment having an array of force sensors and assigned touch sensors, wherein each individual group of force sensors and touch sensors corresponds to the embodiment shown in the FIGS. 3 and 4. Accordingly, an embodiment is conceivable which is formed from a group of a force sensor and a touch sensor as can be found in the embodiment of the FIGS. 1 and 2.

Figure 6:
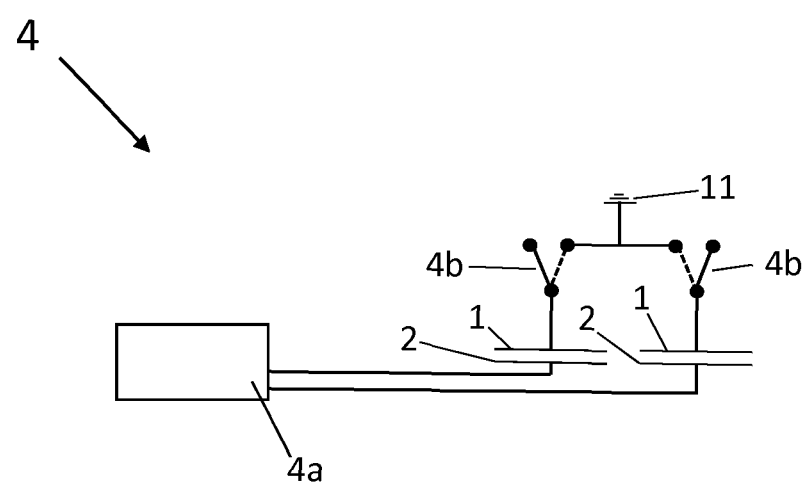
FIG. 6 shows a schematic circuit diagram for illustrating the mode of operation of another embodiment of the evaluation unit 4 according to the present disclosure.

The configuration of the evaluation unit 4 or the mode of operation of another evaluation unit 4 according to the present disclosure is to be explained with reference to FIG. 6. It comprises a computing unit 4a and two associated electric switching means 4b. The switching means 4b has, in each case, switching positions for alternately carrying out the operation-detection step (dashed line in the switching means 4b) and the touch-detection step (continuous line in the switching means 4b). Furthermore, two pairs of, in each case, one first 1 and one second electrode 2 are provided which can be switched by means of the switching means 4b. In an operation-detection step shown in FIG. 6, a first measuring capacitance substantially between the first electrode 1 and the second electrode 2 is applied to the first electrode 1 and the second electrode 2. This is achieved by connecting the first electrode 1, in each case, with the ground 11, while a potential is applied to the second electrode 2 by the computing unit 4a. In the event of an operation, i.e., the action of an operating force F on the input surface F, a change in the first measuring capacitance is caused by the elastic deformation of the first electrode 1 and the accompanying change of position of the first electrode 1 relative to the second electrode 2. When a predetermined threshold of the change in measuring capacitance is reached, the operation that has taken place is supposed to be assigned a switching function by the evaluation unit 4. Given the same operating force, however, since the extent of this capacitance change is strongly dependent on the location of the action on the operating surface F, e.g. in the center or at the edges, but also on the extent of the contact surface of the operating means, there is a need for adapting this threshold. In the present disclosure, this is achieved in the preceding touch-detection step, wherein, at the same time, the first electrode 1 is run in an electrically insulated and statically discharged manner by switching over the respective switching means 4b, so that it constitutes a weak electromagnetic influence, while the second electrode 2 is switched in each case in such a way that a second measuring capacitance is generated whose field is capable of penetrating the through-holes of the first electrode 1.

Figure 7:
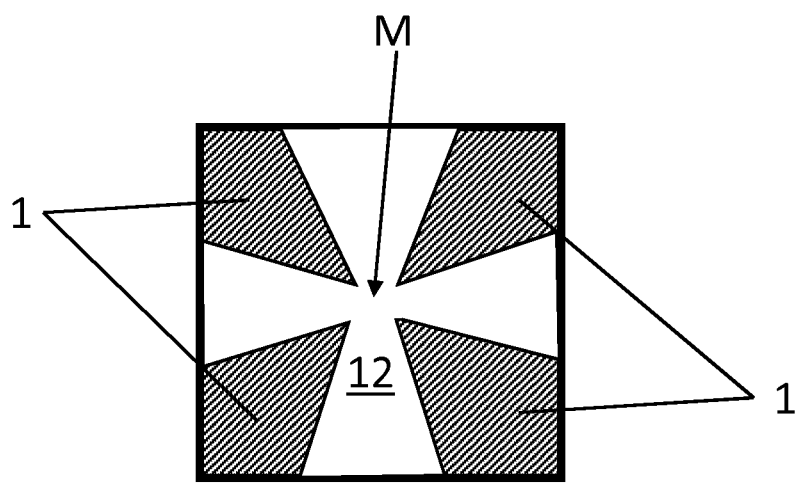
FIG. 7 shows a top view of the first electrode according to another embodiment according to the present disclosure.

FIG. 7 shows an embodiment of an electrode as it is used in the input device according to the present disclosure. Even though the illustration relates to a first electrode 1, the design feature may also relate to the second electrode 2. This form of electrode 2 is characterized in that it forms triangular, conductive surfaces that are connected to one another in an electrically conductive manner, but are spaced apart from each other, forming a central cross-shaped through-hole 12. The triangular surfaces are further disposed with their tips directed towards one another. Thus, the electrode 1 is an exemplary embodiment of an electrode that has a structure changing from its geometric center M in the direction of the edge of the measuring capacitance.

The invention claimed is:
1. An input device, comprising:
a capacitive force sensor;
a capacitive touch sensor assigned to the capacitive force sensor; and
an evaluation circuit,
 wherein the capacitive force sensor includes an operating surface and a first electrode made out of a conductive material, which yields elastically under an action of an operating force acting upon the operating surface during an operation, and a second electrode made out of a conductive material, which is disposed adjacent to and spaced apart from the first electrode, wherein the evaluation circuit is configured to detect, in a touch-detection step, an associated characteristic value of a touch on the operating surface during the operation, the associated characteristic value including at least one of a location or a surface of action of the touch, from the capacitive touch sensor, and wherein the evaluation circuit is further configured to detect, in an operation-detection step shifted in time in relation to the touch-detection step, a measured quantity changing with the operating force by generating a first measuring capacitance between the first and second electrodes and to assign a switching or controlling function to the operation, both in accordance with the characteristic value detected by the capacitive touch sensor in the touch-detection step and in accordance with the measured quantity detected in the operation-detection step, wherein the evaluation circuit is configured to adapt, in accordance with the characteristic value, a threshold for triggering the switching or controlling function in accordance with the measured quantity, and wherein the characteristic value is related to at least one of the location or a contact surface of the touch.

2. The input device of claim 1, wherein the evaluation circuit is configured to use exclusively, in the touch-detection step, the first electrode as an electrode of the capacitive touch sensor generating a second measuring capacitance.

3. The input device of claim 2, wherein the evaluation circuit is configured to run the second electrode in an insulated manner in the touch-detection step.

4. The input device of claim 3, wherein the evaluation circuit is configured to ground the second electrode in the operation-detection step.

5. The input device of claim 1, wherein at least one of the first or second electrodes has a structure changing from its geometric center in the direction of the edge of the measuring capacitance.

6. The input device of claim 1, wherein the first electrode and second electrode differ in the circumferences described by maximum extents thereof.

7. The input device of claim 6, wherein the surfaces described by the maximum extents of the first electrode and second electrode are in the range from 0.5 $cm^2$ to 5.0 $cm^2$.

8. The input device of claim 6, wherein the surface described by the maximum extents of the first electrode or second electrode corresponds to the surface area of the operating surface.

9. The input device of claim 1, wherein a cavity delimited partially or completely by one or more spacers is provided between the first electrode and the second electrode, and the spacer or spacers have a lower elasticity than the first electrode.

10. The input device of claim 1, wherein the evaluation circuit is configured to use exclusively, in the touch-detection step, the second electrode as an electrode of the capacitive touch sensor generating the second measuring capacitance.

11. The input device of claim 10, wherein the first electrode has through-holes.

12. The input device of claim 10, wherein the first electrode is run in an insulated manner in the touch-detection step or the first electrode is grounded in the operation-detection step.

13. The input device of claim 1, wherein the force sensor and the touch sensor are at least partially integrated with each other in a common film layer structure.

14. The input device of claim 1, further including an array of several capacitive force sensors and an associated array of an identical number of capacitive touch sensors.

15. The input device of claim 14, wherein the first electrodes are configured to be electrically insulated from one another and the second electrodes are configured to be electrically insulated from one another.

16. The input device of claim 1, configured for use in a motor vehicle.

17. A method for inputting touch, comprising:
providing an input device comprising a capacitive force sensor, a capacitive touch sensor assigned to the capacitive force sensor, and an evaluation circuit, wherein
the capacitive force sensor includes an operating surface,
a first electrode made of a conductive material, which yields elastically under the action of an operating force acting upon the operating surface during an operation, and
a second electrode made of a conductive material, which is disposed adjacent to and spaced apart from the first electrode;
in a touch-detection step, detecting an associated characteristic value of a touch on the operating surface during the operation, the associated characteristic value including at least one of a location or a surface of action of the touch, by means of the capacitive touch sensor and the evaluation circuit; and
in an operation-detection step shifted in time in relation to the touch-detection step, detecting a measured quantity changing with the operating force by means of the capacitive force sensor and the evaluation circuit by generating a first measuring capacitance between the first electrodes and second electrodes, and
in a subsequent evaluation step, assigning a switching or controlling function is assigned to the operation by the evaluation circuit both in accordance with the characteristic value detected by the capacitive touch sensor in the touch-detection step and in accordance with the measured quantity detected in the operation-detection step,
wherein the evaluation circuit is configured to adapt, in accordance with the characteristic value, a threshold for triggering the switching or controlling function in accordance with the measured quantity, and
wherein the characteristic value is related to at least one of the location or a contact surface of the touch.

* * * * *